(12) United States Patent
Nozaki et al.

(10) Patent No.: US 10,499,537 B2
(45) Date of Patent: Dec. 3, 2019

(54) HEAT SINK AND ELECTRONIC COMPONENT PACKAGE

(71) Applicant: KAGA, INC., Chuo-ku, Tokyo (JP)

(72) Inventors: Masaaki Nozaki, Ishikawa (JP); Yousuke Nakamura, Ishikawa (JP); Masaru Sakamoto, Ishikawa (JP); Hidenori Kontani, Ishikawa (JP); Shuhei Kaneko, Ishikawa (JP); Shu Matsuura, Ishikawa (JP)

(73) Assignee: KAGA, INC., Tokyo (JP)

( * ) Notice: Subject to any disclaimer, the term of this patent is extended or adjusted under 35 U.S.C. 154(b) by 0 days.

(21) Appl. No.: 16/303,479

(22) PCT Filed: Nov. 24, 2016

(86) PCT No.: PCT/JP2016/084715
§ 371 (c)(1),
(2) Date: Nov. 20, 2018

(87) PCT Pub. No.: WO2018/003138
PCT Pub. Date: Jan. 4, 2018

(65) Prior Publication Data
US 2019/0335614 A1   Oct. 31, 2019

(30) Foreign Application Priority Data

Jul. 1, 2016 (JP) ................................ 2016-131966

(51) Int. Cl.
*H05K 7/20* (2006.01)
*H01L 23/467* (2006.01)
(Continued)

(52) U.S. Cl.
CPC ......... *H05K 7/20154* (2013.01); *F28F 13/06* (2013.01); *F28F 13/18* (2013.01);
(Continued)

(58) Field of Classification Search
CPC .................................. F28F 13/06; F28F 3/02
See application file for complete search history.

(56) References Cited

U.S. PATENT DOCUMENTS

| 5,535,816 A * | 7/1996 | Ishida | F28F 3/02 |
| | | | 165/104.33 |
| 8,230,903 B2 * | 7/2012 | Ayotte | H01L 23/367 |
| | | | 165/147 |
| 2008/0190590 A1 * | 8/2008 | Gillard | H01L 23/467 |
| | | | 165/157 |

FOREIGN PATENT DOCUMENTS

| JP | 59-103496 | 7/1984 |
| JP | 05-118782 | 5/1993 |

(Continued)

OTHER PUBLICATIONS

Notification of Reasons for Refusal issued in Japan Counterpart Patent Appl. No. 2017-536368, dated Aug. 25, 2017, along with an English translation thereof.

(Continued)

*Primary Examiner* — Mukundbhai G Patel
(74) *Attorney, Agent, or Firm* — Greenblum & Bernstein, P.L.C.

(57) ABSTRACT

The present invention improves heat dissipation by facilitating the flow of the surrounding air. Provided with a heat sink including: a tabular base part; a tabular protruding piece part that protrudes from the base part toward one side in a thickness direction of the base part; and a tubular protrusion which protrudes from the protruding piece part in a thickness direction of the protruding piece part, and the inside of which is bored in a protruding direction thereof, wherein a plurality of the protruding piece parts is provided along a surface of the base part, and a plurality of the tubular protrusions is provided along a surface of each of the protruding piece parts.

16 Claims, 20 Drawing Sheets

(51) Int. Cl.
F28F 13/06 (2006.01)
F28F 13/18 (2006.01)

(52) U.S. Cl.
CPC ....... *H01L 23/467* (2013.01); *H05K 7/20172* (2013.01); *F28F 2215/00* (2013.01)

(56) References Cited

FOREIGN PATENT DOCUMENTS

| | | |
|---|---|---|
| JP | 07-027158 | 5/1995 |
| JP | 08-288433 | 11/1996 |
| JP | 10-294582 | 11/1998 |
| JP | 11-290968 | 10/1999 |
| JP | 2002-252486 | 9/2002 |
| JP | 3096949 | 7/2003 |
| JP | 2009-200455 | 9/2009 |
| JP | 3170206 | 8/2011 |

OTHER PUBLICATIONS

Decision to Grant a Patent in Japan Counterpart Patent Appl. No. 2017-536368, dated Oct. 3, 2017.
Official Communication issued in International Bureau of WIPO Patent Application No. PCT/JP2016/084715, dated Feb. 7, 2017, along with an English translation thereof.
Written Opinion issued in International Bureau of WIPO Patent Application No. PCT/JP2016/084715, dated Feb. 7, 2017, along with an English translation thereof.

\* cited by examiner

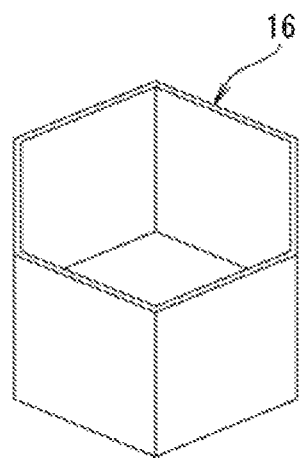
FIG. 20A
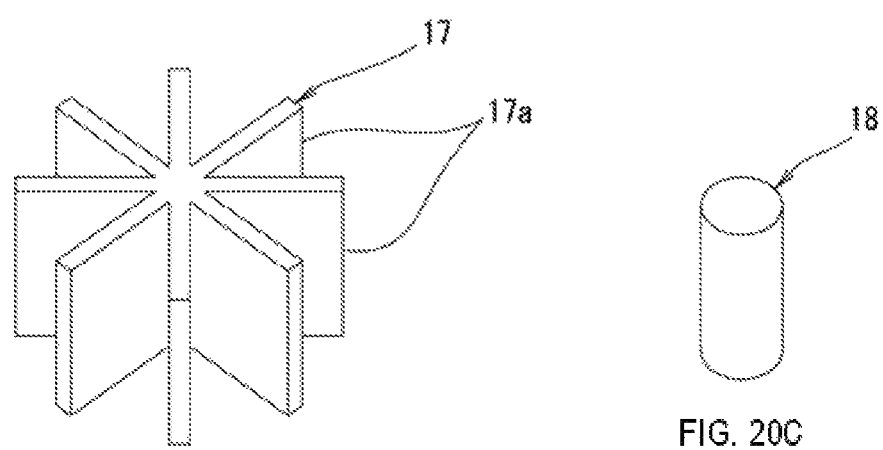
FIG. 20B
FIG. 20C ically constituted heat dissipation device of the related art described above, due to the relatively large surface areas of the fins and the like exposed to the outside air.
HEAT SINK AND ELECTRONIC COMPONENT PACKAGE

TECHNICAL FIELD

The present invention relates to a heat sink and an electronic component package that are configured to dissipate heat of an electronic component and the like.

BACKGROUND ART

As this type of invention, there has conventionally been known a heat dissipation device such as the one described in, for example, PTL 1, which has a base part, protruding pieces protruding upward from the right and left ends of the base part, a plurality of fins (3) protruding outward from each of the protruding pieces, and a power transistor (1) mounted on the base part between the right and left protruding pieces, the heat dissipation device being constituted in a substantially U-shape. Note that numbers in the parentheses are reference numerals used in PTL 1.

CITATION LIST

[Patent Literature]
[PTL 1] Japanese Utility Model Application Publication No. S59-103496 (FIG. 1)

SUMMARY OF INVENTION

Technical Problem

Somewhat effective heat dissipation performance is expected from the three-dimensionally constituted heat dissipation device of the related art described above, due to the relatively large surface areas of the fins and the like exposed to the outside air.

However, the protruding pieces, the plurality of fins and the like obstruct the flow of the surrounding outside air, raising the possibility that unexpected temperature rise occurs due to the stagnating outside air.

Solution to Problem

In view of these problems, the present invention includes the following constitution.

A heat sink, having: a tabular base part; a tabular protruding piece part that protrudes from the base part toward one side in a thickness direction of the base part; and a tubular protrusion which protrudes from the protruding piece part in a thickness direction of the protruding piece part, and the inside of which is bored in a protruding direction thereof, wherein a plurality of the protruding piece parts is provided along a surface of the base part, and a plurality of the tubular protrusions is provided along a surface of each of the protruding piece parts.

Advantageous Effects of Invention

The constitution of the present invention described above can improve heat dissipation thereof by facilitating the flow of the surrounding gas.

BRIEF DESCRIPTION OF DRAWINGS

FIG. 2A is a plan view.
FIG. 2B is a front view.
FIG. 2C is a side view.
FIG. 5A is a plan view.
FIG. 5B is a front view.
FIG. 5C is a side view.
FIG. 7A is a perspective view.
FIG. 7B is a front view.
FIG. 8A is a perspective view.
FIG. 8B is a front view.
FIG. 12A is a plan view.
FIG. 12B is a front view.
FIG. 20A is a perspective view showing another example of the shape of a protrusion of a base part.
FIG. 20B is a perspective view showing another example of the shape of a protrusion of a base part.
FIG. 20C is a perspective view showing another example of the shape of a protrusion of a base part.

DESCRIPTION OF EMBODIMENTS

The first feature of the present embodiment has: a tabular base part; a tabular protruding piece part that protrudes from the base part toward one side is a thickness direction of the base part; and a tubular protrusion which protrudes from the protruding piece part in a thickness direction of the protruding piece part, and the inside of which is bored in a protruding direction thereof, wherein a plurality of the protruding piece parts is provided along a surface of the base part, and a plurality of the tubular protrusions is provided along a surface of each of the protruding piece parts.

The tubular protrusions include cylindrical protrusions, polygonal tubular protrusions, and the like.

The relationship between the tubular protrusions provided on one of the plurality of the protruding piece parts and the tubular protrusions provided on another protruding piece part is not limited; the tubular protrusions on these two protruding piece parts may be in contact with each other or separated from each other with a gap therebetween.

In the second feature, the plurality of the protruding piece parts is provided in parallel at intervals (see FIGS. 1 to 6).

In the third feature, the tubular protrusions provided on one of the protruding piece parts adjacent to each other and the tubular protrusions provided on the other protruding piece part are arranged concentrically (see FIGS. 1 to 6).

Figure 1:
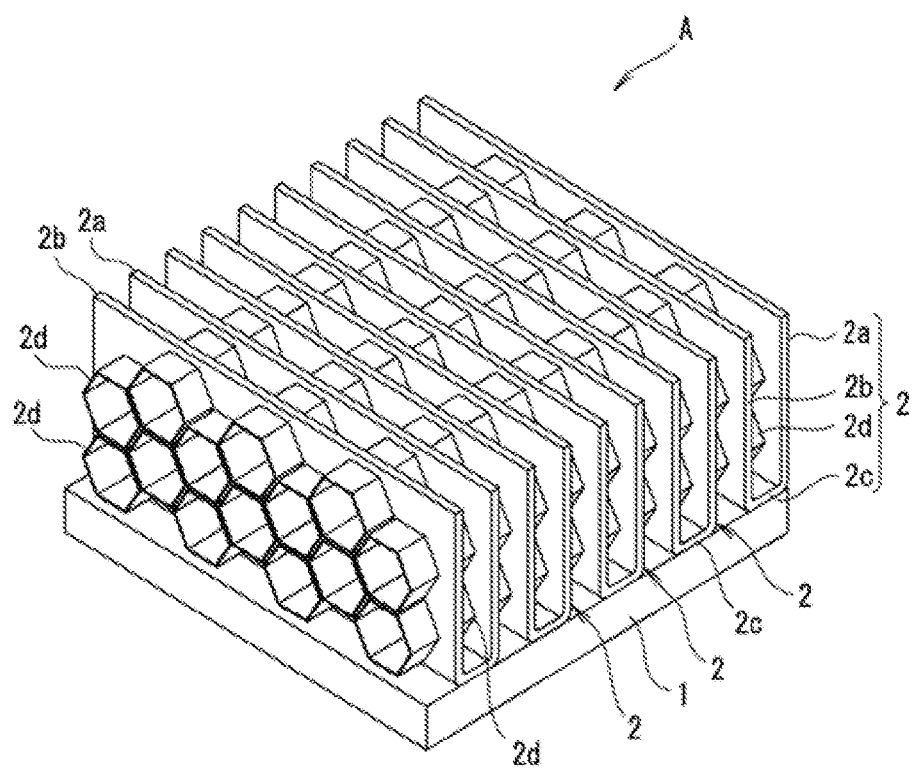
FIG. 1 is a perspective view showing an example of a heat sink according to the present invention.
Figure 2A:
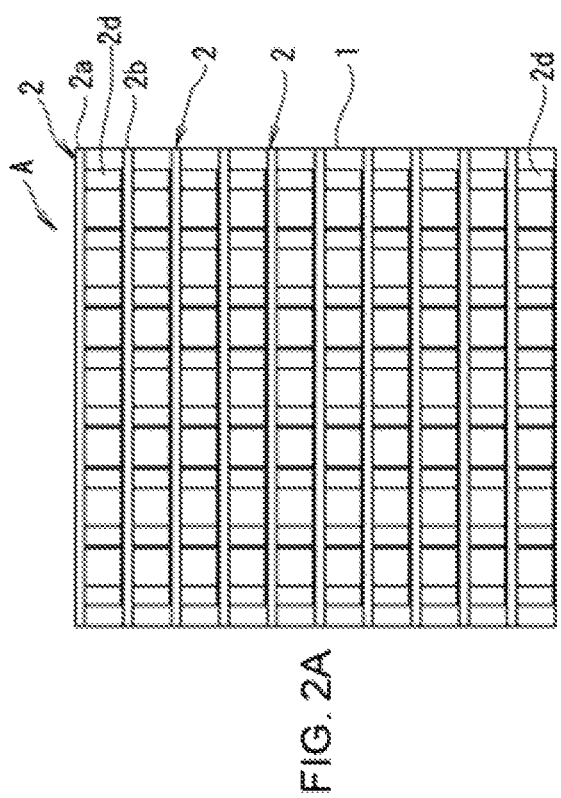
FIG. 2A shows the heat sink, where
Figure 2B:
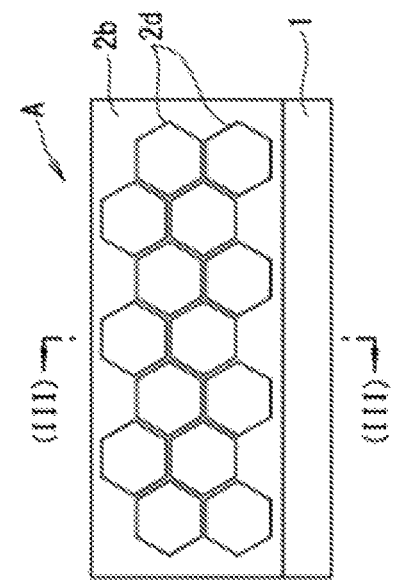
FIG. 2B shows the heat sink, where
Figure 2C:
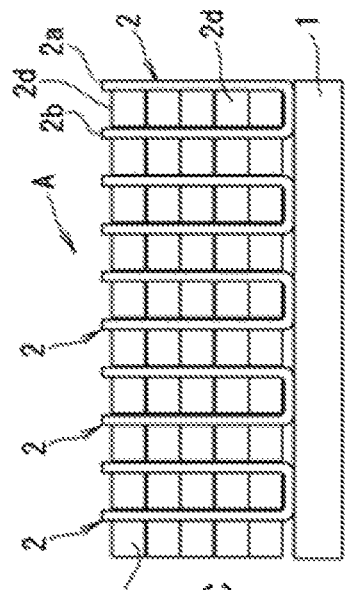
FIG. 2C shows the heat sink, where
Figure 3:
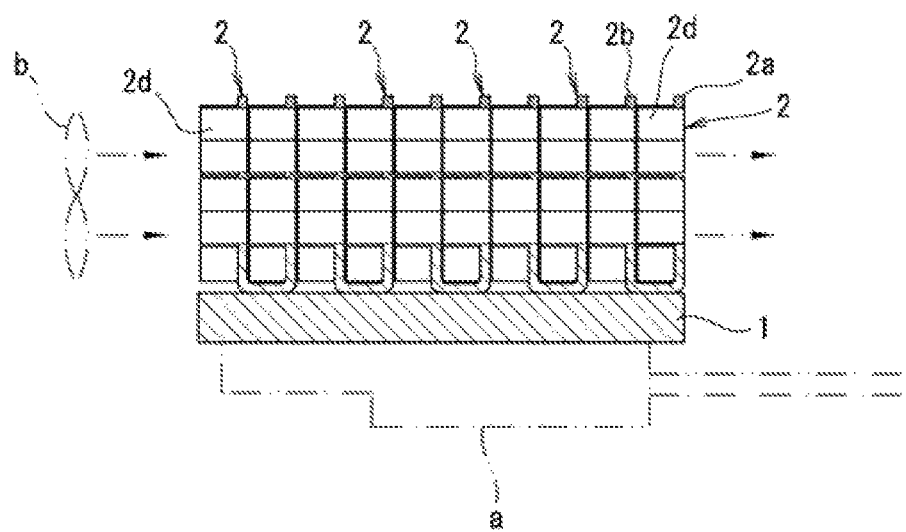
FIG. 3 is a cross-sectional view taken along line (III)-(III) of FIG. 2B.

In the fourth feature, the tubular protrusions provided on one of the protruding piece parts adjacent to each other and the tubular protrusions provided on the other protruding piece part protrude in the same direction, and a tip of each of the tubular protrusions provided on the one protruding piece part is positioned close to or in contact with the other protruding piece part (see FIGS. 1 to 3).

Figure 4:
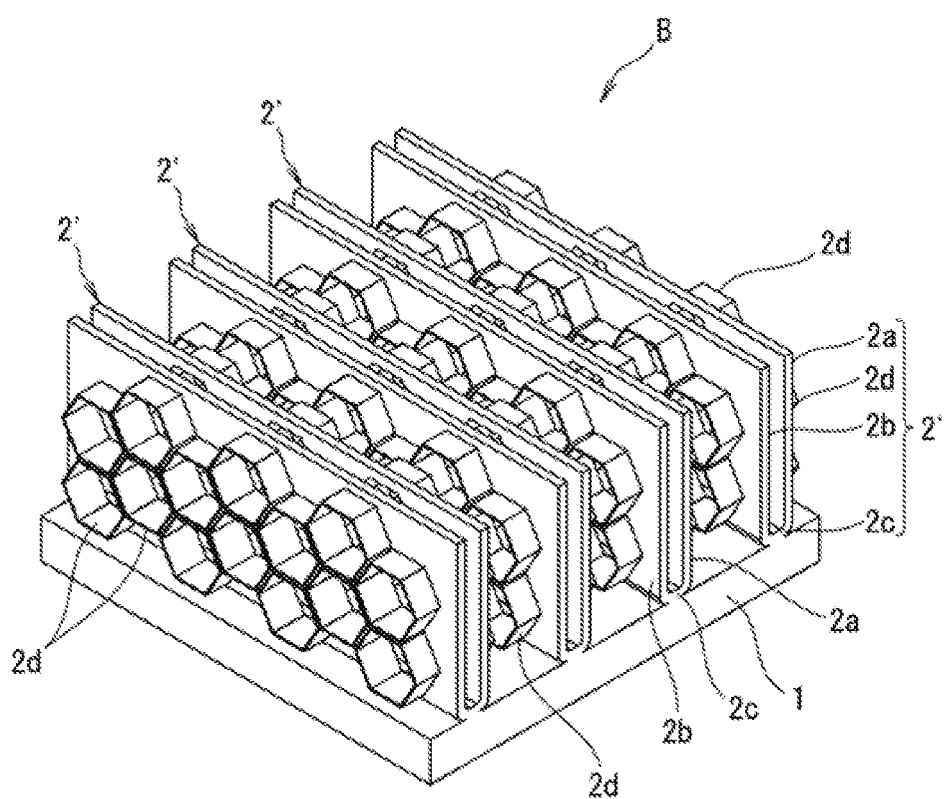
FIG. 4 is a perspective view showing another example of the heat sink according to the present invention.
Figure 5A:
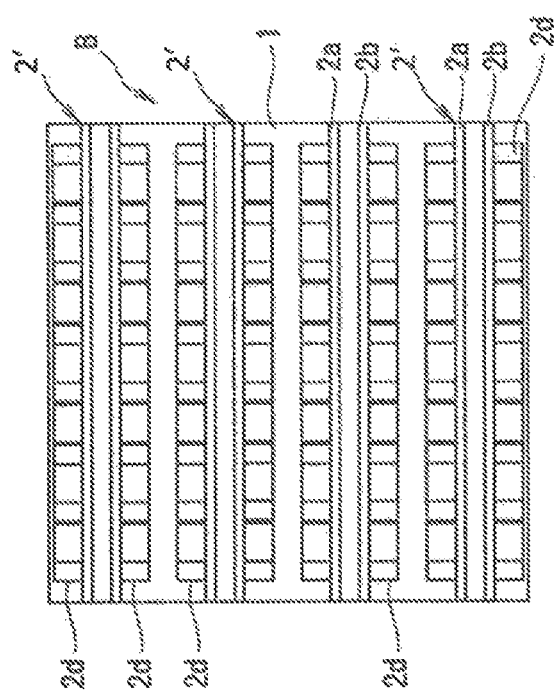
FIG. 5A shows the heat sink, where
Figure 5C:
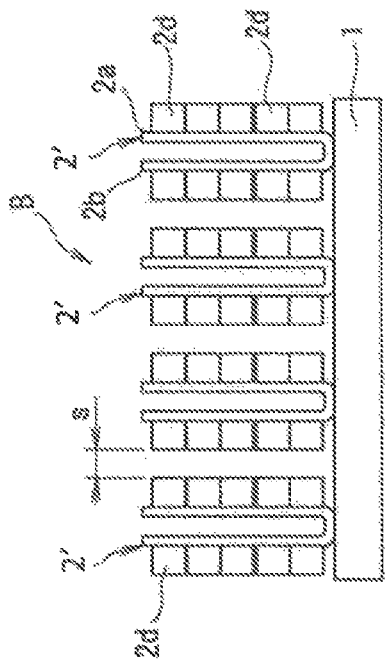
FIG. 5C shows the heat sink, where
Figure 5B:
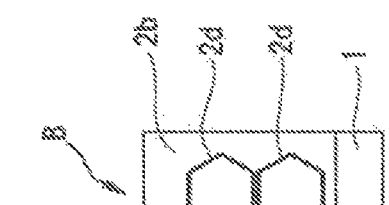
FIG. 5B shows the heat sink, where
Figure 6:
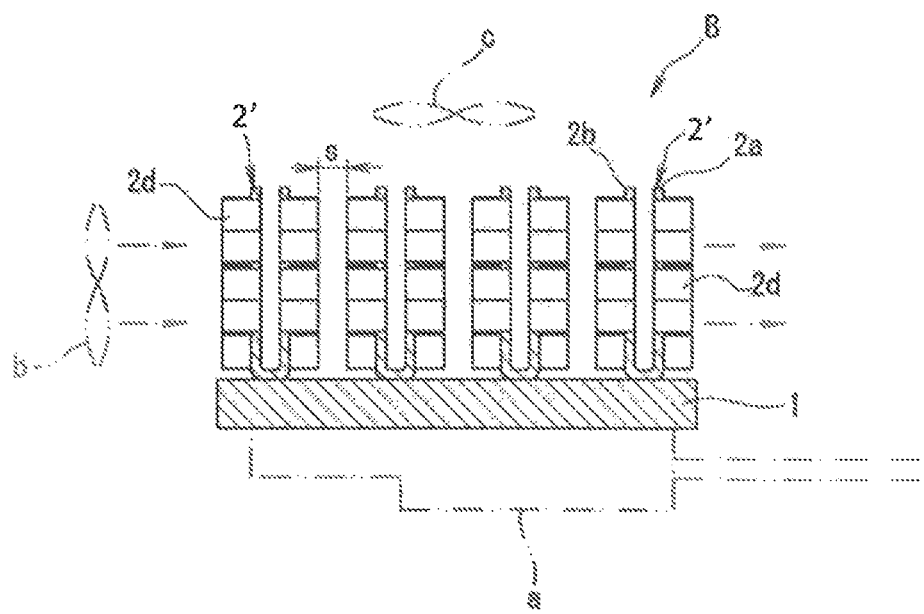
FIG. 6 is a cross-sectional view taken along line (VI)-(VI) of FIG 5B.

In the fifth feature, the tubular protrusions provided on one of the protruding piece parts adjacent to each other and the tubular protrusions provided on the other protruding piece part protrude in directions opposite to each other (see FIGS. 4 to 6).

In the sixth feature, the plurality of the protruding piece parts is arranged in such a manner as to surround a space on one side of the base part in the thickness direction thereof (see FIGS. 9 to 13).

Specific examples of this constitution include an aspect in which the plurality of the protruding piece parts is arranged in a tubular shape having a space therein (e.g., a rectangular tubular shape, a pentagonal tubular shape, a hexagonal tubular shape, a cylindrical shape, and the like).

This constitution also includes an aspect in which protruding piece parts that are adjacent to each other in a peripheral direction are in contact with each other, and an aspect in which the protruding piece parts that are adjacent to each other in the peripheral direction are not in contact with each other but are positioned close to each other.

In the seventh feature, each of the tubular protrusions is formed in a polygonal tubular shape (see FIGS. 1 to 6, 14 to 16C, 19A and 19B).

Figure 15:
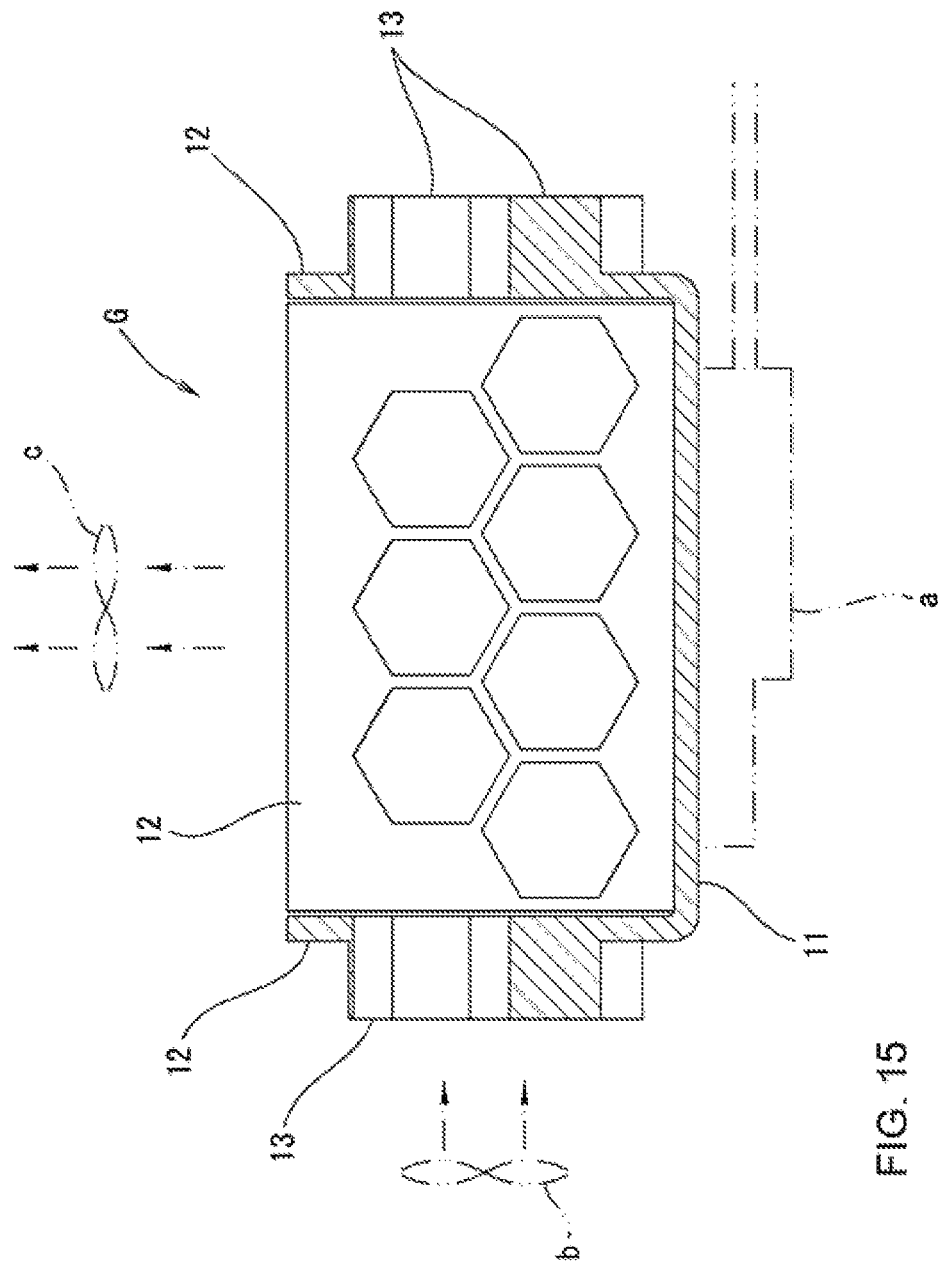
FIG. 15 is a cross-sectional view taken along line (XV)-(XV) of FIG. 14.
Figure 16:
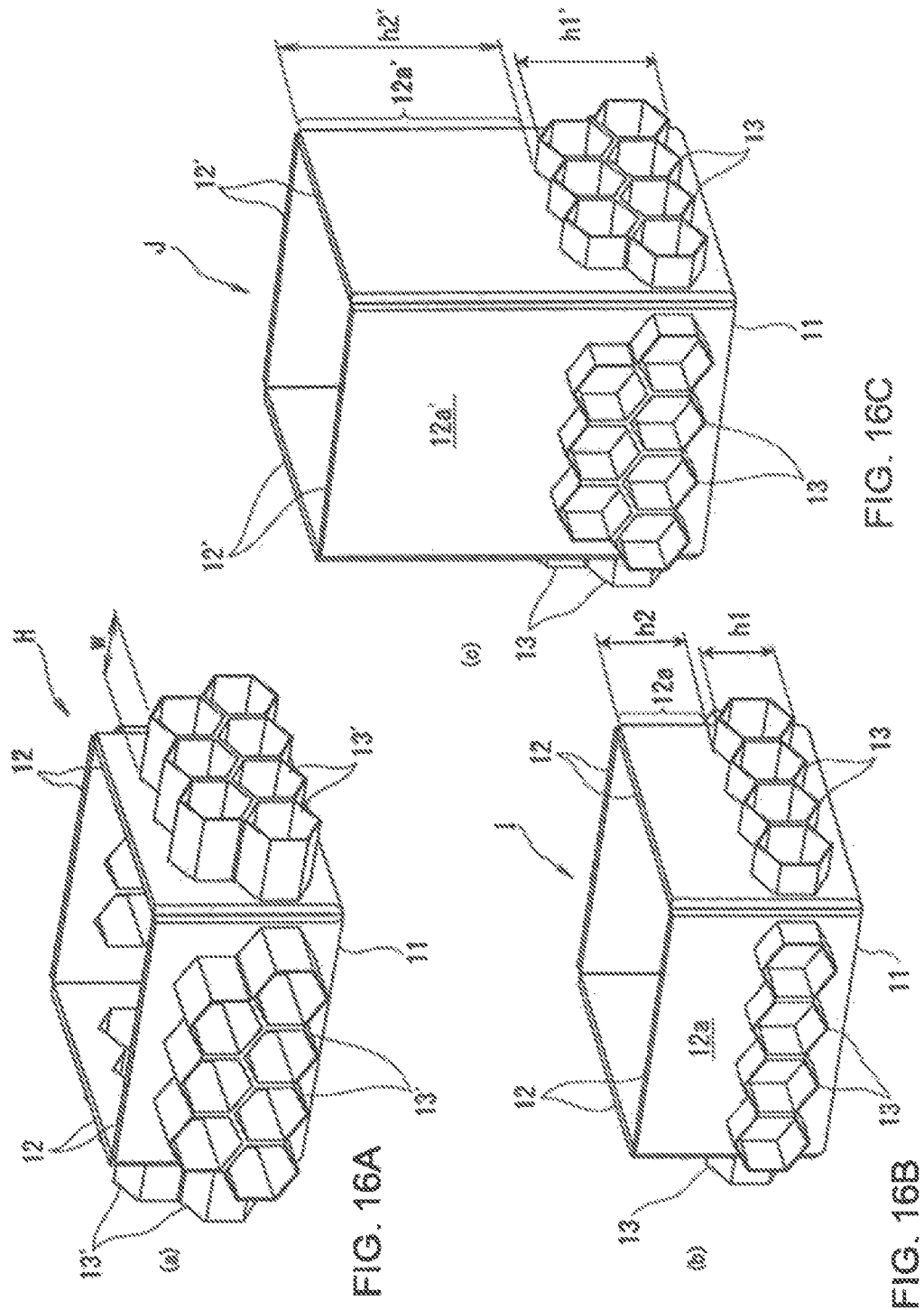
FIG. 16A is a perspective view showing another example of the heat sink according to the present invention.
FIG. 16B is a perspective view showing another example of the heat sink according to the present invention.
FIG. 16C is a perspective view showing another example of the heat sink according to the present invention.

In the eighth feature, among the plurality of the tubular protrusions, two tubular protrusions adjacent to each other are formed integrally while sharing a wall part located therebetween (see FIGS. 15 to 16C).

In the ninth feature, among the plurality of the tubular protrusions, two tubular protrusions adjacent to each other have outer wall surfaces parallel to each other, and these parallel outer wall surfaces are positioned close to each other (see FIGS. 1 to 6, 19A and 19B).

In the tenth feature, exposed surfaces of the base part, the protruding piece parts, and the tubular protrusions are each covered with an alumite layer.

In the eleventh feature, the base part is provided with a protrusion protruding toward the space (see FIGS. 7A, 7B, 9, 10, 19A, 19B and 20A to 20C).

Figure 11:
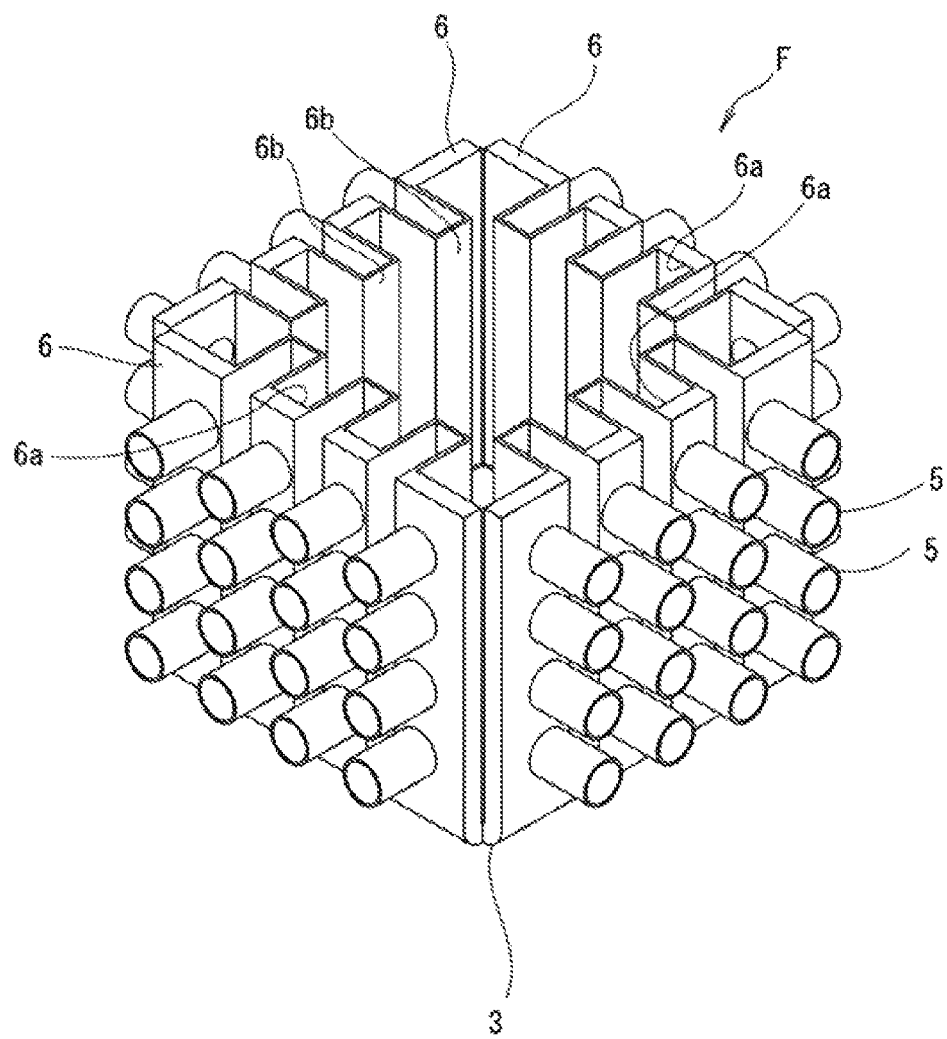
FIG. 11 is a perspective view showing another example of the heat sink according to the present invention.
Figure 12:
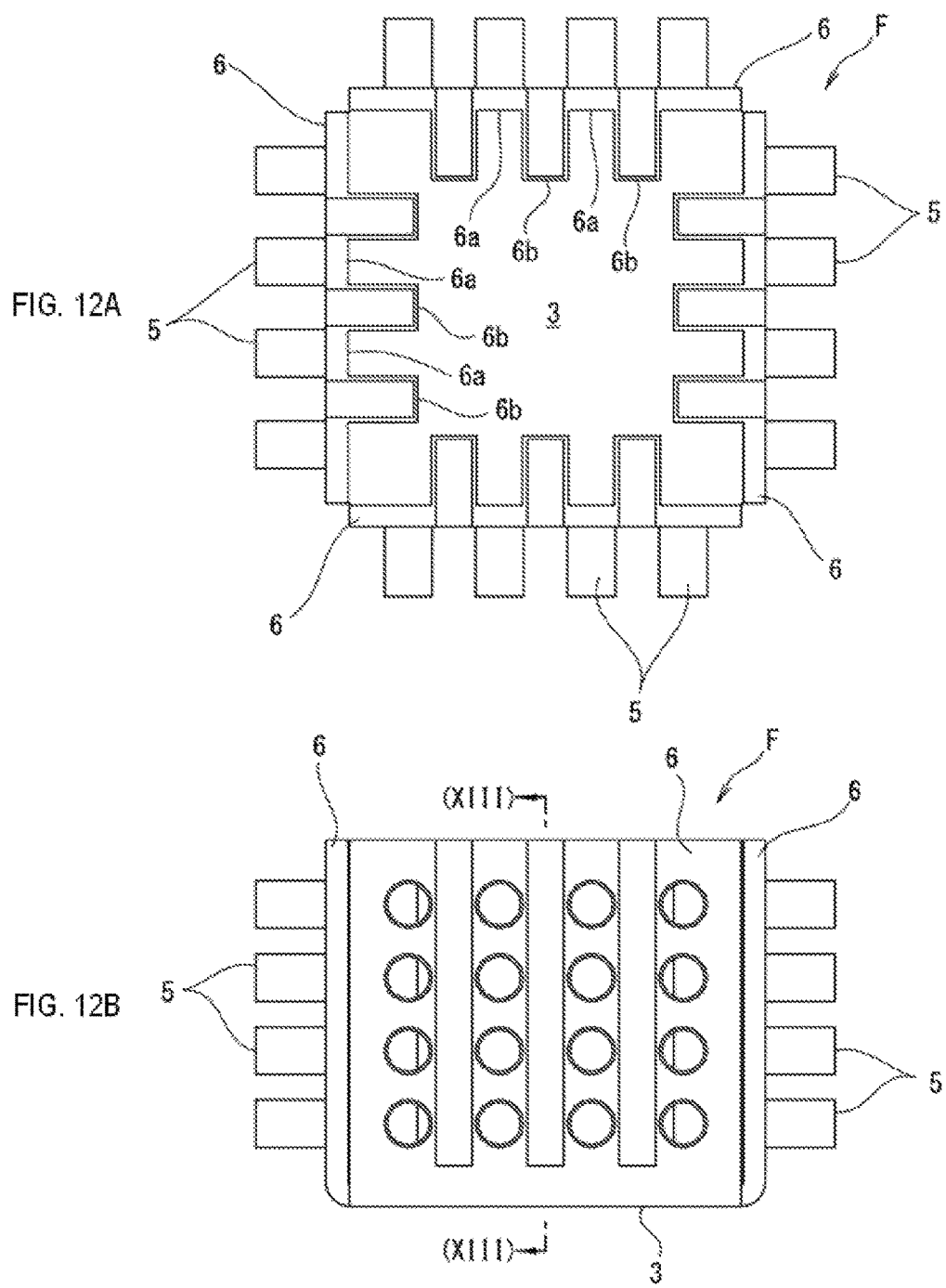
FIG. 12A shows the heat sink of FIG. 11, where
FIG. 12B shows the heat sink of FIG. 11, where
Figure 13:
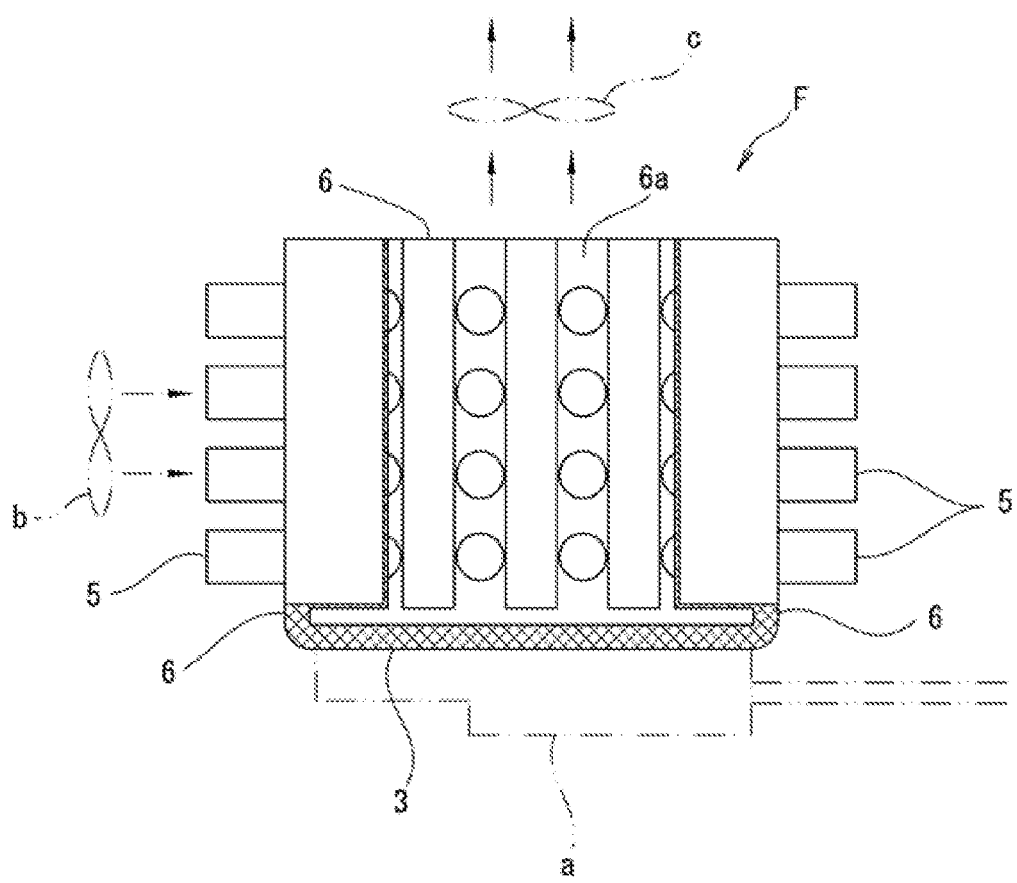
FIG. 13 is a cross-sectional view taken along line (XII)-(XIII) of FIG. 12B.

In the twelfth feature, an inner wall surface of each of the protruding piece parts is provided with a groove extending in a direction crossing the base part, and the tubular protrusions each communicate with the groove (see FIGS. 11 to 13).

In the thirteenth feature, a fan is provided such that gas in the vicinity of the tubular protrusions is caused to flow (see FIGS. 3, 6, 7A, 7B, 8A, 8B, 10, 13, 15 and 19B).

According to an especially preferred aspect, the fan is provided in such a manner as to allow the gas to flow into the tubular protrusions. Specifically, possible aspects include an aspect in which the fan is provided so as to face the openings of the tubular protrusions at one end side, and an aspect in which the fan is provided so as to suck the gas from the openings of the tubular protrusions at the one end side.

Furthermore, in a constitution where the plurality of the protruding piece parts is arranged so as to surround a space, other preferred aspects include an aspect in which the fan is provided so as to send air toward the space, and an aspect in which the fan is provided so as to suck the gas from the space.

In the fourteenth feature, an electronic component is brought into contact with and supported by the base part, thereby constituting an electronic component package (see FIGS. 3, 6, 7A, 7B, 8A, 8B, 10, 13, 15 and 19B).

<First Embodiment>

Specific embodiments having the foregoing features are described next in detail with reference to the drawings.

This heat sink A is integrally constituted by a base part 1 and a plurality of heat dissipating parts 2 protruding from the base part 1 toward one side in a thickness direction of the base part 1 (upward, according to the illustrated example).

The base part 1 is formed into a rectangular flat tabular shape. This base part is formed of, for example, a metallic material such as aluminum, copper, stainless steel, nickel, or magnesium, or an alloy material containing these metallic materials.

The heat dissipating parts 2 are each integrally constituted by two substantially parallel protruding piece parts 2a, 2b, a connecting piece part 2c connecting these protruding piece parts 2a, 2b, and tubular protrusions 2d provided on each of the protruding piece parts 2a, 2b, and are arranged in parallel side by side along an upper surface of the base part 1 and fixed thereto.

The material of the heat dissipating parts 2 may be the same as that of the base part 1 but can be different from that of the base part 1.

The protruding piece parts 2a, 2b are provided substantially in parallel at a predetermined interval, and the ends of these protruding piece parts 2a, 2b at one side are connected to each other by the connecting piece part 2c, thereby constituting a substantially U-shaped cross section, with an upper portion thereof being opened.

These protruding piece parts 2a, 2b and the connecting piece part 2c are provided in a continuous, elongated manner between one side of the base part 1 and the other side thereof opposed to the one side.

The connecting piece part 2c is fixed to the base part 1 by welding, adhesion, or the like.

The tubular protrusions 2d are formed in a polygonal (a regular hexagonal shape, in the illustrated example) tubular shape, protruding toward one side in a thickness direction of each of the protruding piece parts 2a, 2b and having the inside bored in a protruding direction thereof.

More specifically, the protruding piece part 2a on one side allows the tubular protrusions 2d thereof to protrude toward one side in the thickness direction of the protruding piece part 2a, and a plurality of these tubular protrusions 2d is arranged side by side along a surface of the protruding piece part 2a. Tubular protrusions 2d adjacent to each other are disposed in such a manner that surfaces thereof are brought close to or in contact with each other. In other words, the plurality of the tubular protrusions 2d is arranged in the form of a honeycomb (see FIGS. 1 and 2B).

On the other protruding piece part 2b as well, the tubular protrusions 2d thereof protrude toward the one side and are arranged in the form of a honeycomb.

The tubular protrusions 2d on the protruding piece part 2a on one side and the tubular protrusions 2d on the other protruding piece part 2b are arranged concentrically.

Between two heat dissipating parts 2 adjacent to each other, the tubular protrusions 2d on one of these heat dissipating parts 2 are arranged concentrically with respect to the tubular protrusions 2d of the other heat dissipating part 2 that have the same positional relation with the former tubular protrusions 2d.

Therefore, internal spaces of these plurality of tubular protrusions 2d arranged concentrically communicate with one another in the direction of respective central axes thereof.

Tips of the tubular protrusions 2d on the protruding piece part 2a on one side are close to or in contact with the other protruding piece part 2b. Also, the tubular protrusions 2d on the other heat dissipating part 2 are close to or in contact with the protruding piece part 2a constituting another adjacent heat dissipating part 2 (see FIG. 2C).

A method for manufacturing the heat dissipating parts 2 is described next. First, the plurality of tubular protrusions 2d described above is formed by subjecting a metallic flat tabular raw material to plastic working using upper and lower dies, punching, and the like. Next, this resultant flat plate having the tubular protrusions 2d is bent to have the U-shaped cross section described above.

The heat dissipating parts 2 formed in this manner are arranged on the base part 1 at even intervals and fixed thereto by welding, adhesion, or the like.

Then, an electronic component "a" (e.g., a CPU, a transistor, a thyristor, another semiconductor and an electronic component) is fixed to the heat sink A having the foregoing constitution by bringing a lower surface of the base part 1 into contact with the electronic component "a" (see FIG. 3).

Furthermore, a fan "b" is provided to allow the outside air in the vicinity of the tubular protrusions 2d to flow.

According to the example shown in FIG. 3, the fan "b" is provided in such a manner as to send the outside air into the tubular protrusions 2d from a position away from the plurality of the heat dissipating parts 2 arranged on the surface of the base part 1, the position being away from the heat dissipating parts 2 in a direction in which the heat dissipating parts 2 are arranged side by side.

The fan "b" may be fixed to, for example, the heat sink A or to a stable section other than the heat sink A (such as a substrate or the like on which the electronic component "a" is mounted).

Another example may be an aspect in which the fan "b" is disposed so as to suck the air inside the tubular protrusions 2d.

Therefore, according to the heat sink A having the foregoing constitution, the flowability of the gas in the vicinity of the heat dissipating parts 2 can be improved by the tubular protrusions 2d, thereby eventually effectively dissipating heat from surfaces of the heat dissipating parts 2 to the outside air.

Moreover, because the plurality of the tubular protrusions 2d is arranged close to or in contact with each other in the form of a honeycomb and the tips of the respective tubular protrusions 2d are positioned close to or in contact with the adjacent protruding piece parts 2a, 2b, the entire heat sink A can be constituted into a structure of relatively high mechanical strength.

Note that, in this heat sink A, although the tips of the tubular protrusions 2d that protrude from one of the protruding piece parts 2a, 2b adjacent to each other are brought close to or into contact with the other protruding piece part, another example is possible in which an ample space is secured between these protruding piece parts and the gas is allowed to flow into this space.

<Second Embodiment>

Another embodiment of a heat sink and electronic component package according to the present invention is described next. Since the following embodiment is a partial modification of the foregoing embodiment, the modified sections are mainly described in detail and the same reference numerals are used to describe the same sections; the redundant explanations are omitted accordingly.

For a heat sink B shown in FIGS. 4 to 6, the heat dissipating parts 2 of the heat sink A are replaced with heat dissipating parts 2', and a pitch of the plurality of heat dissipating parts 2' is made wider.

The heat dissipating parts 2' are different from the heat dissipating parts 2 in terms of a protruding direction of tubular protrusions 2d.

More specifically, on each of the heat dissipating parts 2', the tubular protrusions 2d provided on a protruding piece part 2a, which is one of the protruding piece parts 2a, 2b adjacent to each other, and the tubular protrusions 2d provided on the other protruding piece part 2b, are caused to protrude in the directions opposed to each other (see FIG. 5C).

The plurality of the heat dissipating parts 2' is arranged on a base part 1 at a relatively wide pitch in a direction of the central axes of the tubular protrusions 2d, and fixed to the base part 1. Therefore, a relatively wide gap s (see FIG. 5C) is secured between the opposing tubular protrusions 2d on the heat dissipating parts 2' adjacent to each other.

A electronic component "a" is fixed to the heat sink B having the foregoing constitution by bringing the lower surface of the base part 1 into contact with the electronic component "a" (see FIG. 6).

Furthermore, the heat sink B is provided with a fan "b" and/or a fan "c".

The fan "b" is provided in a position away from the tubular protrusions 2d located at the farthest end out of a plurality of the tubular protrusions 2d arranged in the axial direction, and sends the outside air into the tubular protrusions 2d.

According to the illustrated example, the fan "c" is provided above the plurality of the heat dissipating parts 2' so as to send the outside air toward each gap s formed between the heat dissipating parts 2' adjacent to each other.

According to this constitution, heat dissipation efficiency can be improved by forcibly sending the outside air to each gap s between the heat dissipating parts 2'.

Note that, as other examples, aspects are possible in which the fan "c" is provided in a position away in the direction in which the protruding piece parts 2a, 2b stretch (the near side or the far side of FIG. 6) and in which the fan "c" sucks the gas between the heat dissipating parts 2' adjacent to each other.

The method for manufacturing the heat sink B is substantially the same as that of the heat sink A, wherein when performing plastic working on the tubular protrusions 2d, the tubular protrusions 2d on the protruding piece part 2a on one side and the tubular protrusions 2d on the other protruding piece part 2b are caused to protrude in the same direction. Then, the protruding piece parts 2a, 2b and the connecting piece part 2c are bent in such a manner that the tubular protrusions 2d on the one and the other sides are opposed to each other, and thereafter the connecting piece part 2c is connected to the base part 1.

Therefore, according to the heat sink B, in a situation where the heat sink B is installed, favorable heat dissipation performance can be achieved especially when a flow of gas is present between the heat dissipating parts 2' adjacent to each other.

According to the heat sinks A, B described above, the two protruding piece parts 2a, 2b are constituted integrally and connected to the base part 1. However, as another example, an aspect is possible in which a plurality of independent protruding piece parts is arranged on the base part 1 and fixed thereto.

In addition, according to the heat sinks A, B, as a particularly favorable aspect, two tubular protrusions 2d that are adjacent to each other in the direction of the central axis are disposed concentrically. However, as another example, an aspect is possible in which one of these tubular protrusions 2d is shifted with respect to the other tubular protrusion 2d in a direction crossing the central axis.

Furthermore, according to the heat sinks A, B, as a particularly favorable aspect, each of the tubular protrusion 2d is formed in a regular hexagonal tubular shape. However, another example is possible in which these tubular protrusions 2d are formed into other tubular shapes such as a cylindrical shape, a triangular tubular shape, a rectangular tubular shape, a pentagonal tubular shape, other polygonal tubular shape, an elliptic tubular shape, and a heart tubular shape.

<Third Embodiment>

Figure 7A:
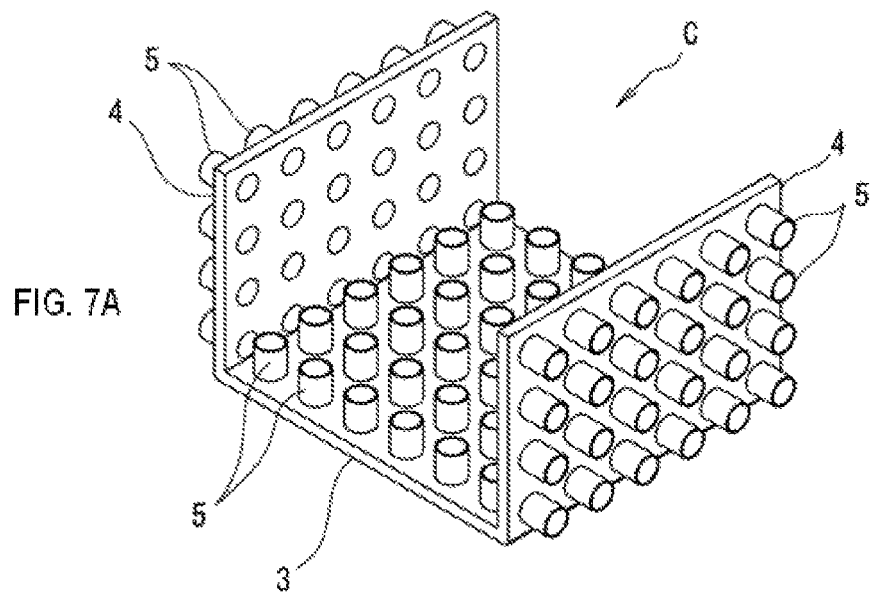
FIG. 7A shows another example of the heat sink according to the present invention, where
Figure 7B:
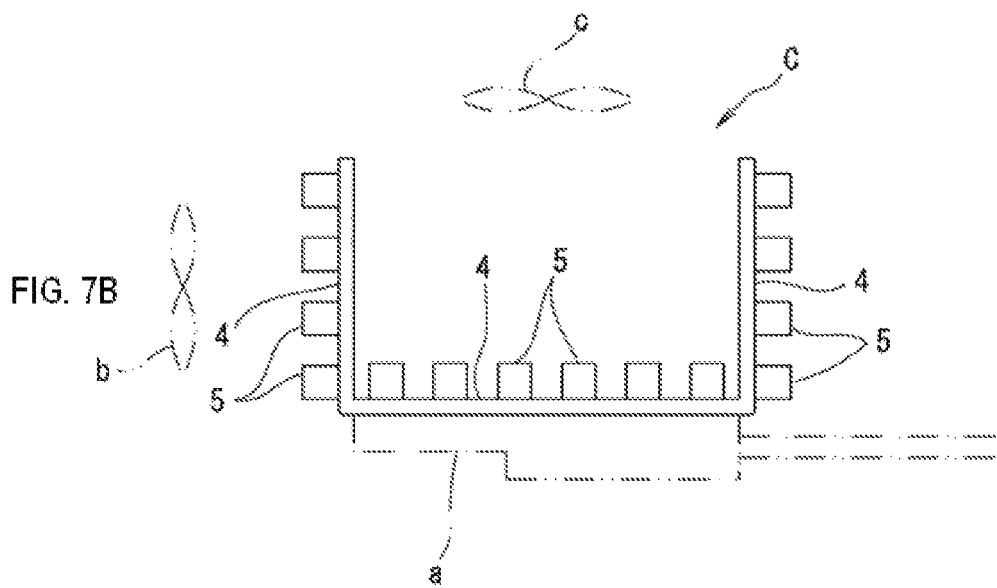
FIG. 7B shows another example of the heat sink according to the present invention, where

A heat sink C shown in FIGS. 7A and 7B is formed of the same metallic material as the heat sink A and integrally constituted by a flat tabular base part 3, protruding piece parts 4 provided at opposing ends of this base part 3 and protruding from the base part 3 toward one side in a thickness direction thereof, and tubular protrusions 5 protruding from the base part 3 and the protruding piece parts 4.

The base part 3 is provided with a large number of the tubular protrusions 5 that protrude toward an internal space formed by the base part 3 and the protruding piece parts 4 (upward, in the diagram).

The two protruding piece parts 4 are each provided with a large number of tubular protrusions 5 that protrude toward outer spaces formed by the base part 3 and the protruding piece parts 4 (toward the sides, in the illustrated example).

Each of the tubular protrusions 5 is a cylindrical protrusion having a through hole.

As shown in FIG. 7B, a lower surface of the base part 3 is brought into contact with the electronic component "a" and fixed thereto.

If needed, fans "b", "c" are provided above and/or on the side of the heat sink C.

Therefore, according to the heat sink C having the foregoing constitution, the tubular protrusions 5 can allow the gas between the protruding piece parts 4 to flow, thereby eventually effectively dissipating the heat transmitted from the electronic component "a".

<Fourth Embodiment>

Figure 8A:
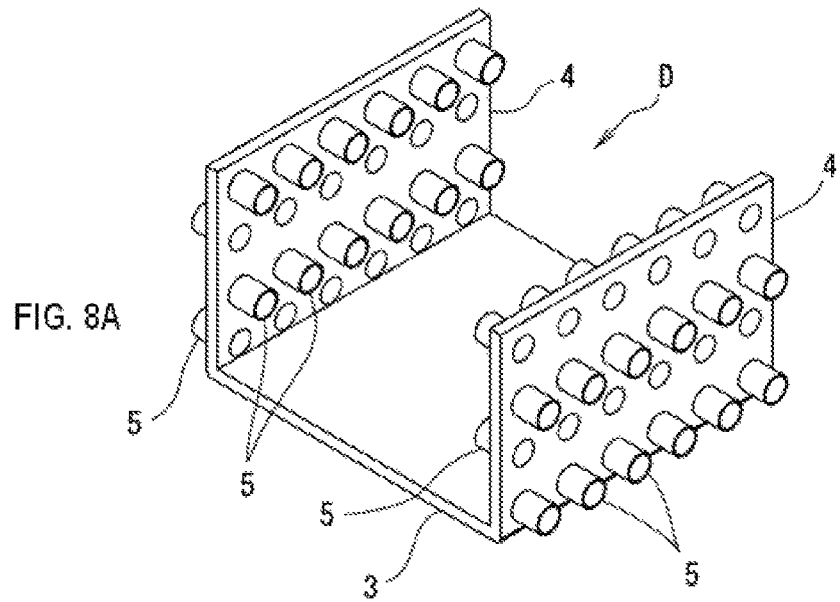
FIG. 8A shows another example of the heat sink according to the present invention, where
Figure 8B:
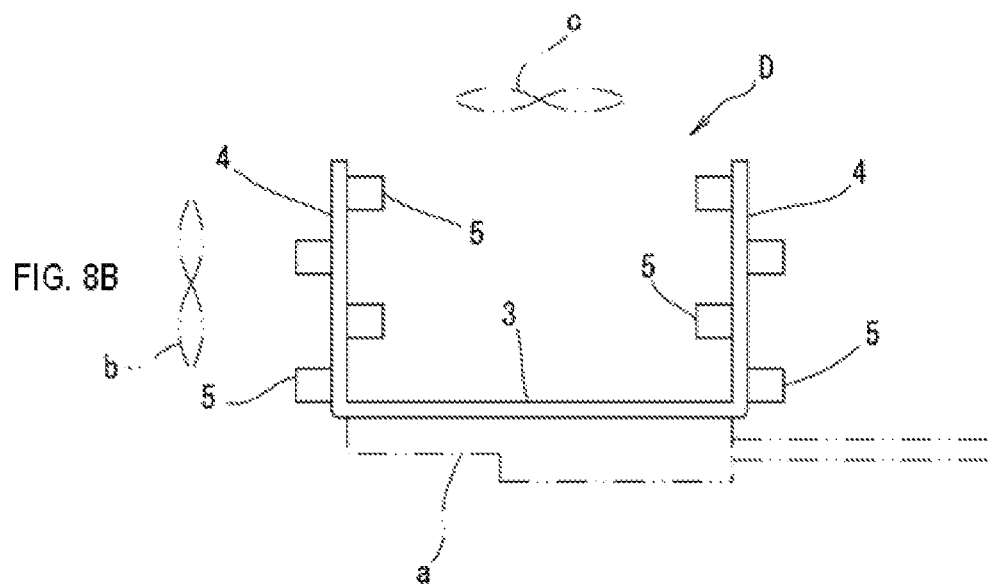
FIG. 8B shows another example of the heat sink according to the present invention, where

A heat sink D shown in FIGS. 8A and 8B is obtained by changing the arrangement of the tubular protrusions 5 of the heat sink C described above.

In this heat sink D, a base part 3 is formed in a flat tabular shape that does not have a tubular protrusions 5. Protruding piece parts 4 protrude from the both opposing ends of the base part 3 toward one side in the thickness direction thereof.

The protruding piece parts 4 are each provided with a plurality of the tubular protrusions 5 protruding toward an internal space formed by the protruding piece parts 4 and the base part 3, and a plurality of tubular protrusions 5 protruding toward the opposite sides.

In this heat sink D, the lower surface of the base part 3 is brought into contact with an electronic component "a" and fixed thereto, and, if needed, fans "b", "c" are provided above and/or on the side of the heat sink D (see FIGS. 8A and 8B).

According to the heat sink D, as with the heat sink C, the tubular protrusions 5 can allow the gas between the protruding piece parts 4 to flow, thereby eventually effectively dissipating the heat transmitted from the electronic component "a".

<Fifth Embodiment>

Figure 9:
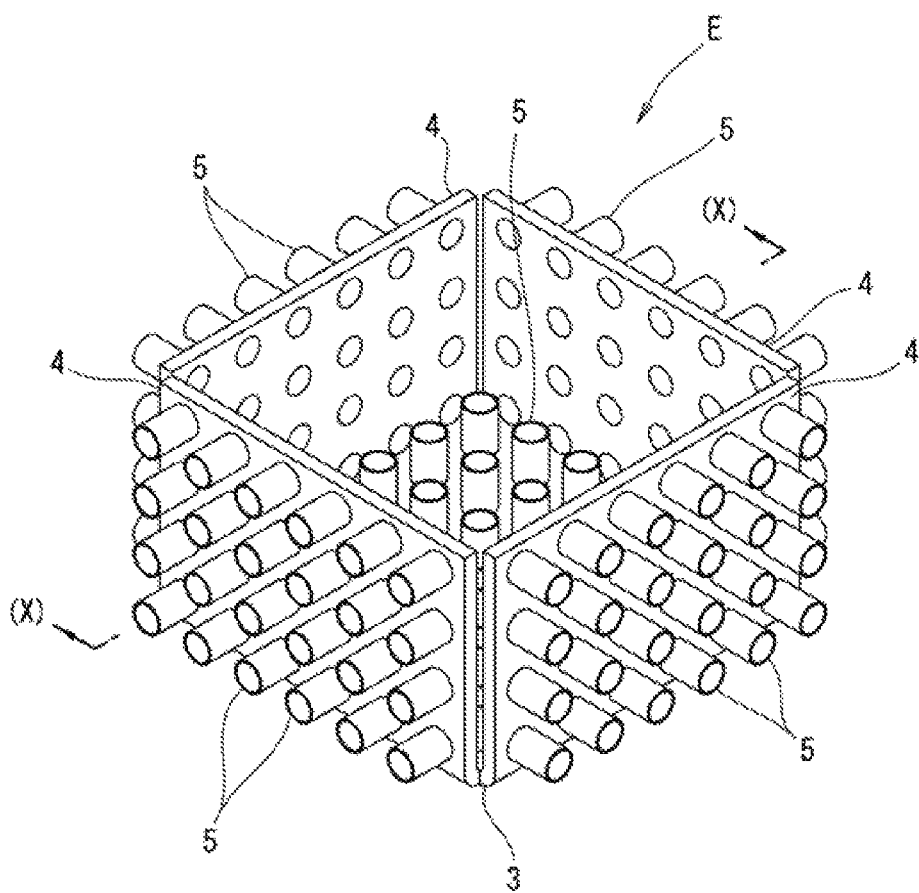
FIG. 9 is a perspective view showing another example of the heat sink according to the present invention.

A heat sink E shown in FIG. 9 is obtained by adding two more protruding piece parts 4 and more tubular protrusions 5 to the heat sink C described above.

More specifically, a base part 3 is constituted into a rectangular tabular shape (a substantially square tabular shape, in the illustrated example), and the protruding piece parts 4 protruding toward one side in a thickness direction of the base part 3 are provided to the respective sides of the base part 3.

In other words, a plurality of the protruding piece parts 4 is arranged in the shape of a rectangular frame in a planar view, so as to surround a space on the upper side of the base part 3.

The base part 3 is provided with a large number of tubular protrusions 5 protruding upward, and protruding piece parts 4 are each provided with a large number of tubular protrusions 5 protruding outward.

According to the heat sink E having the foregoing constitution, a plurality of the tubular protrusions 5 is formed by plastic working, and the protruding piece parts 4 around the base part 3 are formed by bending.

In this heat sink E as well, the lower surface of the base part 3 is brought into contact with an electronic component "a" and fixed thereto.

Figure 10:
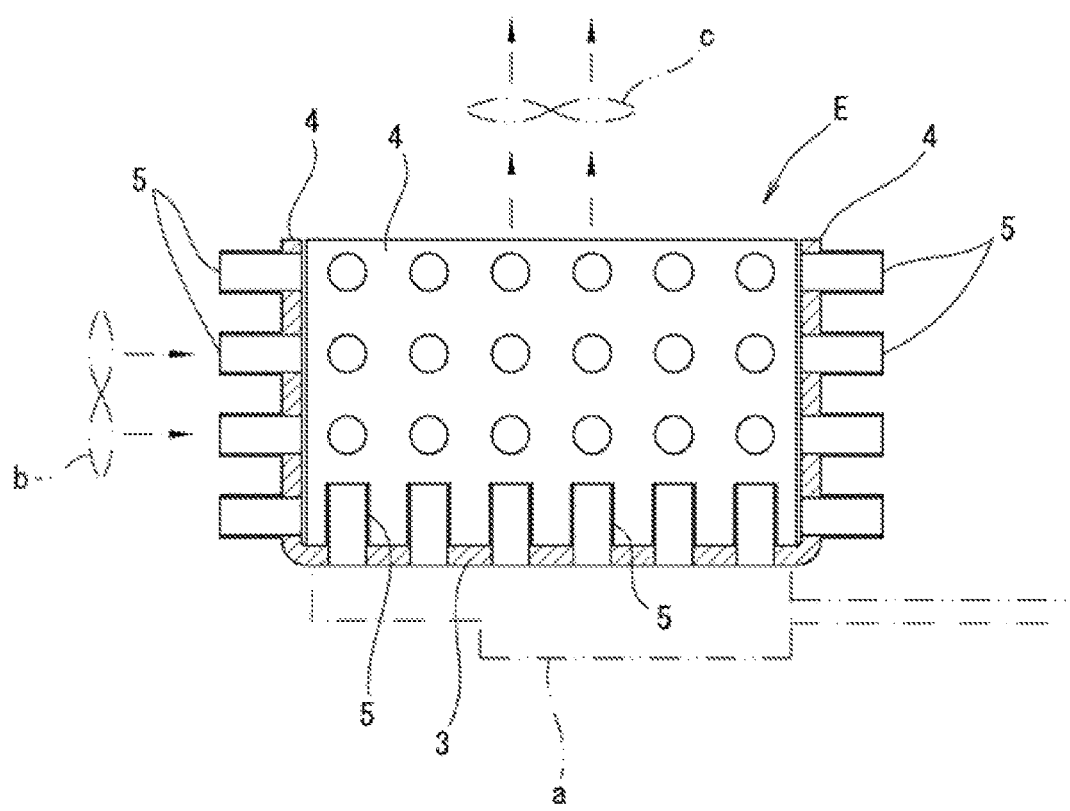
FIG. 10 is a cross-sectional view taken along line (X)-(X) of FIG. 9.

In the example shown in FIG. 10, a fan "b" for sending air to the openings of the tubular protrusions 5 is provided on the side of the heat sink E, and the fan "c" for sucking the gas on the upper side of the base part 3 is provided above the heat sink E.

Other possible examples include an aspect in which either one of the fans "b" and "c" is omitted, an aspect in which the directions in which the fan "b" and the fan "c" send air are reversed, and an aspect in which both of the fan "b" and the fan "c" are omitted.

Therefore, according to the heat sink E, as with the foregoing embodiments, the tubular protrusions 5 on each of the protruding piece part 4 can improve the flowability of the gas around the protruding piece parts 4, thereby eventually effectively dissipating the heat transmitted from and conducted through the electronic component "a".

<Sixth Embodiment>

A heat sink F shown in FIG. 11 has a flat tabular base part 3, a plurality of protruding piece parts 6 that protrudes from rims of the base part 3 toward one side in a thickness direction thereof and surround a space on the upper side of the base part 3, and tubular protrusions 5 which protrude from each of the protruding piece parts 6 in a thickness direction of the protruding piece parts 6, and the inside of which is bored in a protruding direction thereof.

The tubular protrusions 5 are provided in such a manner as to protrude toward a space outside the plurality of the protruding piece parts 6, and the inside and the outside of each of the protruding piece parts 6 are caused to communicate with each other by cylindrical spaces formed inside the respective tubular protrusions 5.

An inner wall surface of each protruding piece part 6 is provided with a groove 6a extending in a direction orthogonal to the base part 3 (the vertical direction, in the illustrated example), and each of the tubular protrusions 5 communicates with a bottom surface of the groove 6a.

A plurality of the grooves 6a is provided on each protruding piece part 6 at intervals in a width direction (a direction in which each of the sides of the base part 3 extends).

Each groove 6a is a groove with a concave cross section recessed from the inside toward the outside of each protruding piece part 6 in the thickness direction thereof, the grooves extending in the vertical direction, and the end thereof on one side in the extending direction (the upper ends, in the illustrated example) communicating with the outside air.

A method for manufacturing the heat sink F is now described. First, a flat tabular member is formed by connecting the protruding piece parts 6 to the respective sides of the base part 3. Then, plastic working using upper and lower dies, punching, and the like is performed on this flat tabular member, thereby a plurality of protruding stripes 6b protruding toward one side in the thickness direction is formed in parallel at intervals, and each groove 6a is formed between the protruding stripes 6b adjacent to each other.

Next, a wall part constituting a bottom surface of each groove 6a is subjected to plastic working in a direction opposite to the foregoing one direction, to form a plurality of the tubular protrusions 5.

Note that an order in which a process on the grooves 6a and a process on the tubular protrusions 5 may be reversed.

In this heat sink F as well, a lower surface of the base part 3 is brought into contact with an electronic component "a" and fixed thereto.

In the example shown in FIG. 13, a fan "b" for sending air to the openings of the tubular protrusions 5 is provided on the side of the heat sink F, and a fan "c" for sucking gas on the upper side of the base part 3 is provided above the heat sink F.

Other possible examples include an aspect in which either one of the fans "b" and "c" is omitted, an aspect in which the directions in which the fan "b" and the fan "c" send air are reversed, and an aspect in which both of the fans "b" and "c" are omitted.

Therefore, according to the heat sink F, not only is it possible for the tubular protrusions 5 on each protruding piece part 6 to allow the gas on the inside and the outside of the protruding piece parts 6 to flow, but also the gas flowing into the protruding piece parts 6 through spaces inside the tubular protrusions 5 can be lifted up along the grooves 6a and discharged to the outside of the heat sink F, thereby eventually effectively dissipating the heat transmitted from and conducted through an electronic component "a".

<Seventh Embodiment>

Figure 14:
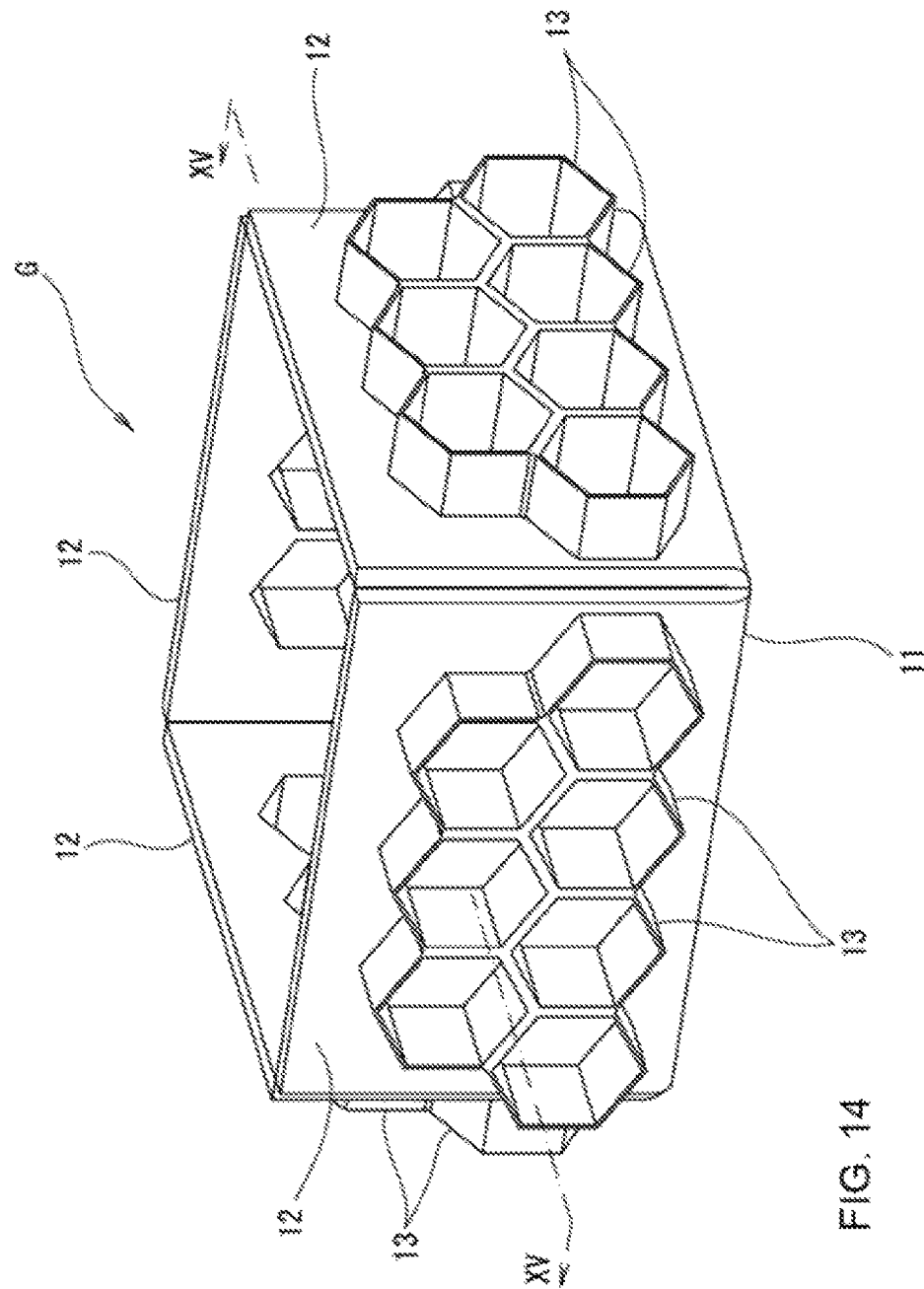
FIG. 14 is a perspective view showing another example of the heat sink according to the present invention.

A heat sink G shown in FIGS. 14 and 15 has a tabular base part 11, a plurality of tabular protruding piece parts 12 that protrudes from the base part 11 toward one side in a thickness direction of the base part 11 (upward, in the illustrated example) and surround a space on this one side, and a plurality of tubular protrusions 13 which protrudes from each of the protruding piece parts 12 in a thickness direction of the protruding piece part 12, and the inside of which is bored in a protruding direction thereof.

According to the illustrated example, the base part 11 is formed in a rectangular flat tabular shape (a square shape, in the illustrated example) not having protrusions or through holes.

Four of the protruding piece parts 12 are provided on the respective sides of the base part 11 and each of the four protruding piece parts 12 protrudes upward from the base part 11. These protruding piece parts 12 can be formed by bending a metal plate material.

The plurality of the tubular protrusions 13 is formed in a tubular shape, protruding outward in the thickness direction of the protruding piece parts 12 and having the inside bored in the protruding direction thereof, and are arranged side by side along surfaces of the protruding piece parts 12.

Among the plurality of the tubular protrusions 13, two tubular protrusions 13 adjacent to each other are formed integrally while sharing a wall part located therebetween.

According to the illustrated example, the plurality of the tubular protrusions 13 is each formed in a polygonal shape (a regular hexagonal shape, in the illustrated example) in a planar view and are arranged in the form of a honeycomb.

In the heat sink G shown in FIG. 14, the plurality of the tubular protrusions 13 is provided in two rows, the top row and the bottom row, in the lateral direction, and a number of tubular protrusions 13 in the top row (three, in the illustrated example) is set to be lower than a number of tubular protrusions 13 in the bottom row (four, in the illustrated example).

In this heat sink G, as with the heat sink E and the like described above (see FIG. 10), a lower surface of the base part 11 is mounted onto contact with an electronic component "a". If needed, fans "b", "c" are provided around this heat sink G (see FIG. 15).

Therefore, according to the heat sink G, a gas flowing into the protruding piece parts 12 through spaces inside the tubular protrusions 13 can be lifted up by heat dissipated from an upper surface of the base part 11 and discharged to the outside of the heat sink G, thereby eventually effectively dissipating the heat transmitted from and conducted through the electronic component "a".

Moreover, according to the illustrated example, because the plurality of the tubular protrusions 13 is constituted into the shape of a honeycomb, mechanical strength of the entire heat sink G including these tubular protrusions 13 can be kept high.

<Eighth to Tenth Embodiments>

Heat sinks H, I, J shown in FIGS. 16A to 16C are obtained by changing part of the constitution of the heat sink G described above.

In the heat sink H, the tubular protrusions 13 of the heat sink G are replaced with tubular protrusions 13'. A protruding distance w by which the tubular protrusions 13' protrude from an outer surfaces of protruding piece parts 12 is set to be greater than that of the tubular protrusions 13 (see FIG. 16A).

According to the illustrated example, the protruding distance w of the tubular protrusions 13' in the heat sink H is set to be approximately twice a protruding distance of the tubular protrusions 13 in the heat sink G.

The heat sink I, on the other hand, is obtained by omitting the tubular protrusions 13 of the top rows from the tubular protrusions 13 provided in the top and bottom rows in the heat sink G, and providing a flat region 12a not having any tubular protrusions 13, through holes, or the like, above the tubular protrusions 13 in each of the bottom rows (see FIG. 16B).

Vertical width h2 of the flat region 12a is set to be equal to or greater than vertical width h1 of the tubular protrusions 13 arranged in the lateral direction.

In the heat sink J, the protruding piece parts 12 of the heat sink G are replaced with protruding piece parts 12'. The protruding height of the protruding piece parts 12' from the base part 11 is set to be greater than that of the protruding piece parts 12, and a flat region 12a' not having any tubular protrusions 13, through holes, or the like, is provided above the plurality of the tubular protrusions 13 (see FIG. 16C).

Vertical width h2' of the flat region 12a' is set to be equal to or greater than vertical width h1' of the tubular protrusions 13 arranged in the top and bottom rows in the lateral direction.

<Comparative Experiments>

Next are described results of comparative experiments performed on the heat sinks G, H, I, J of the foregoing constitutions.

Figure 17:
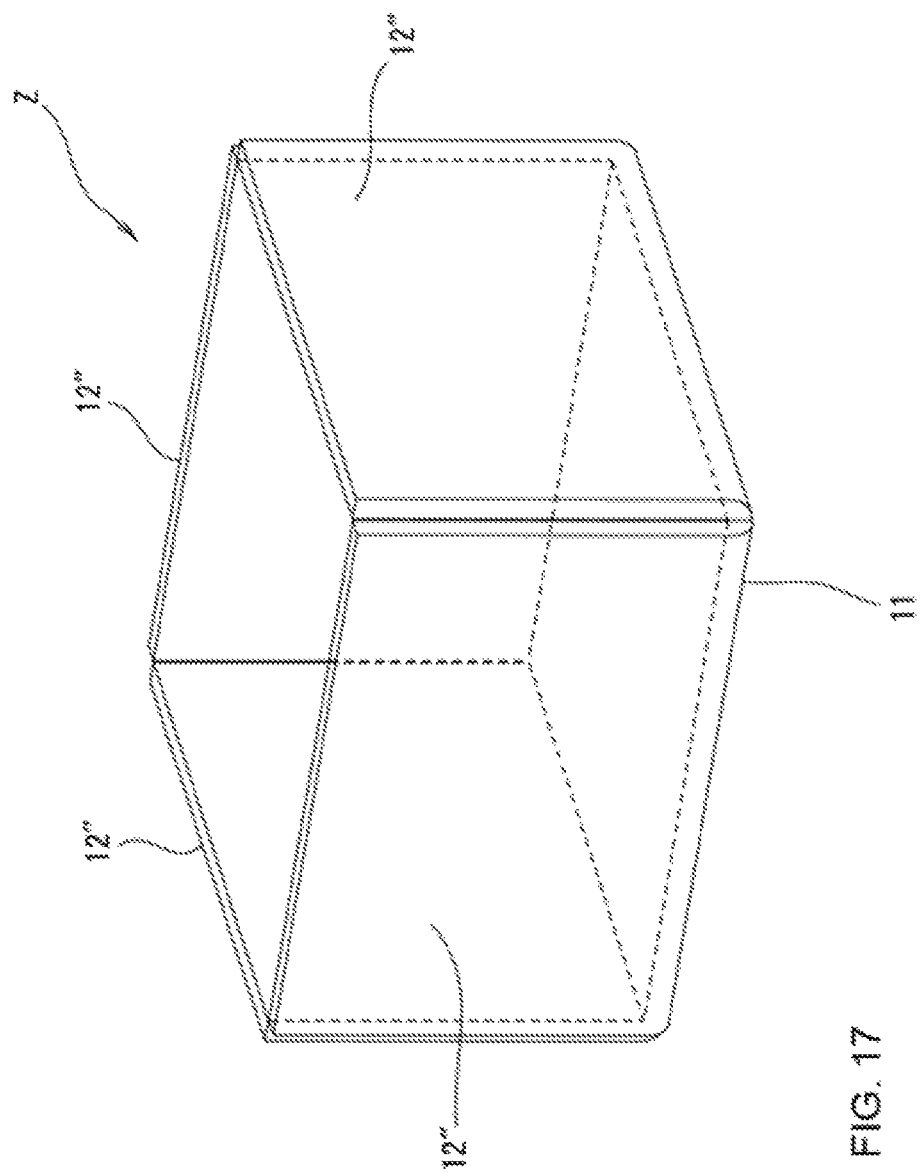
FIG. 17 is a perspective view showing a comparative example in relation to the heat sink according to the present invention.

A heat sink Z shown in FIG. 17 was used as a comparative example. The heat sink Z was obtained by omitting all of the tubular protrusions 13 from the heat sink G and replacing the protruding piece parts 12 with flat tabular protruding piece parts 12" that do not have any protrusions or through holes.

In a experimental method for each of the heat sinks G, H, I, J, Z, a lower surface of the base part 11 was brought into contact with a ceramic heater, and changes in temperature of this contact portion were observed.

Figure 18:
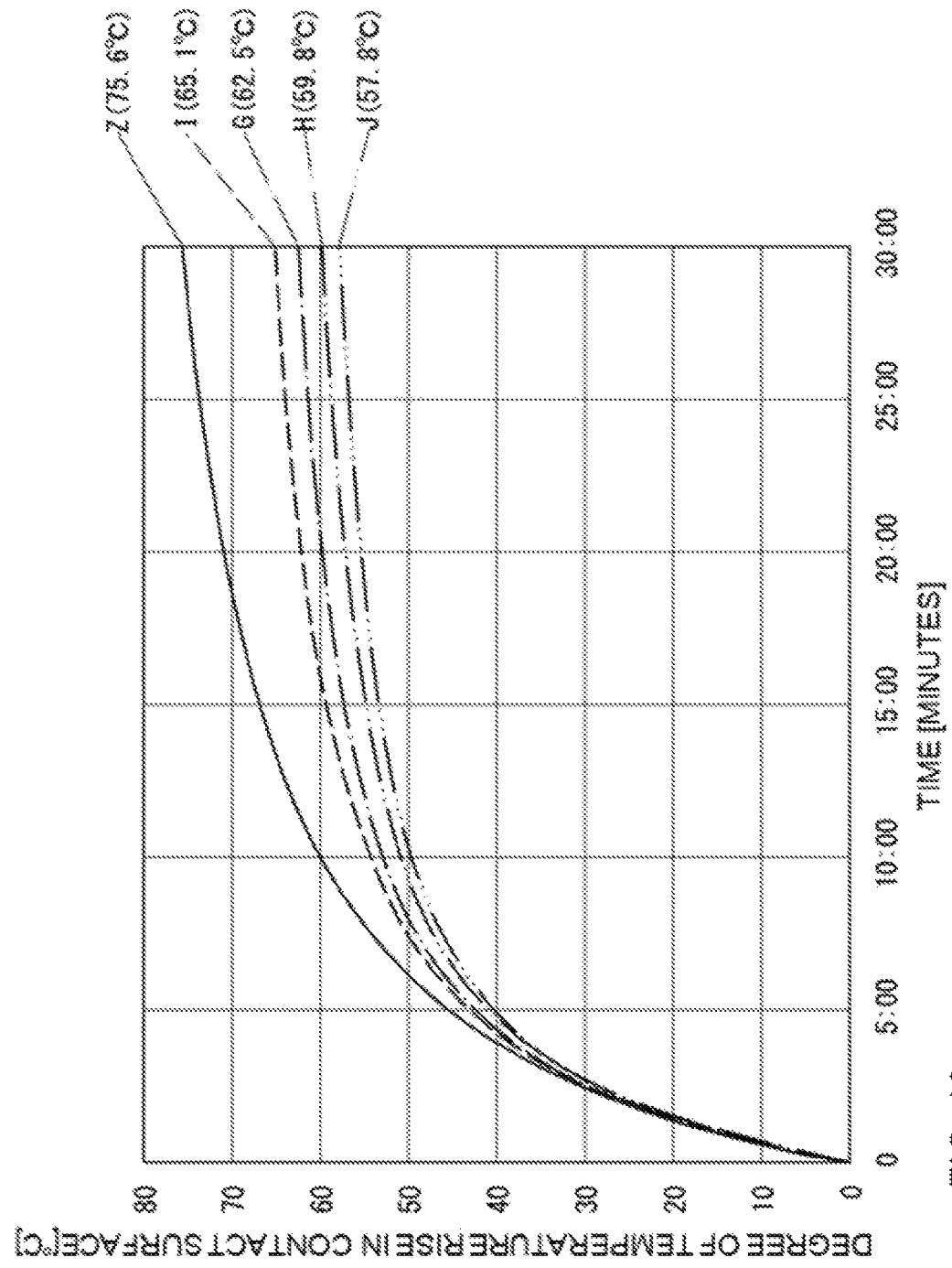
FIG. 18 is a graph showing the results of the comparative experiments.

The graph shown in FIG. 18 shows changes in degrees of temperature rise with respect to elapsed time in the contact portions of the respective heat sinks G, H, I, J, Z.

As the experimental results show, the degrees of temperature rise in the contact portions of the respective heat sinks after a lapse of thirty minutes were ranked from lowest to highest in the order of the heat sinks J, H, G, I, and Z. Therefore, it is conceivable that the heat dissipation effect becomes greater in this order.

<Eleventh Embodiment>

Figure 19A:
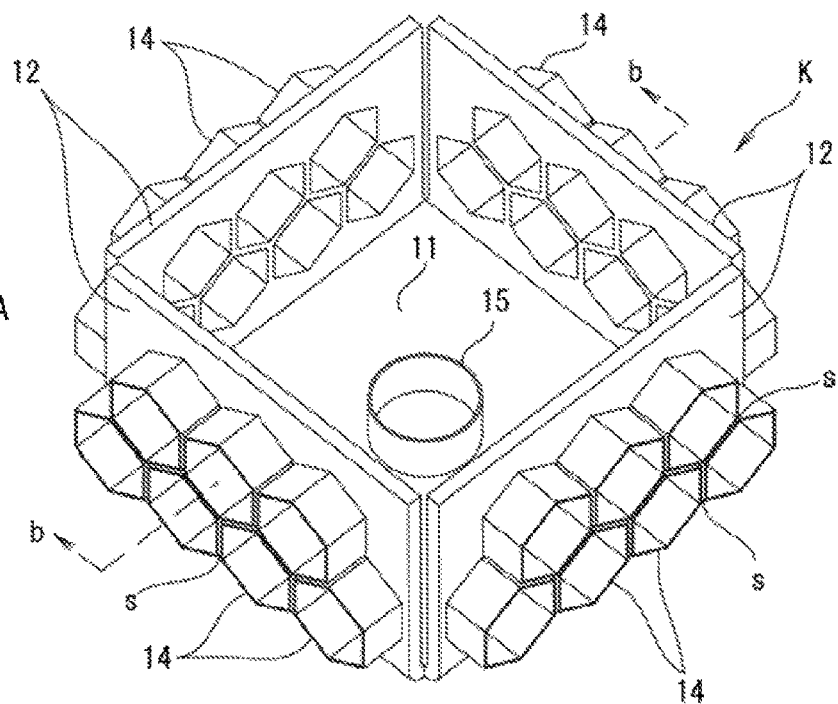
FIG. 19A is a perspective view showing another example of the heat sink according to the present invention.
Figure 19B:
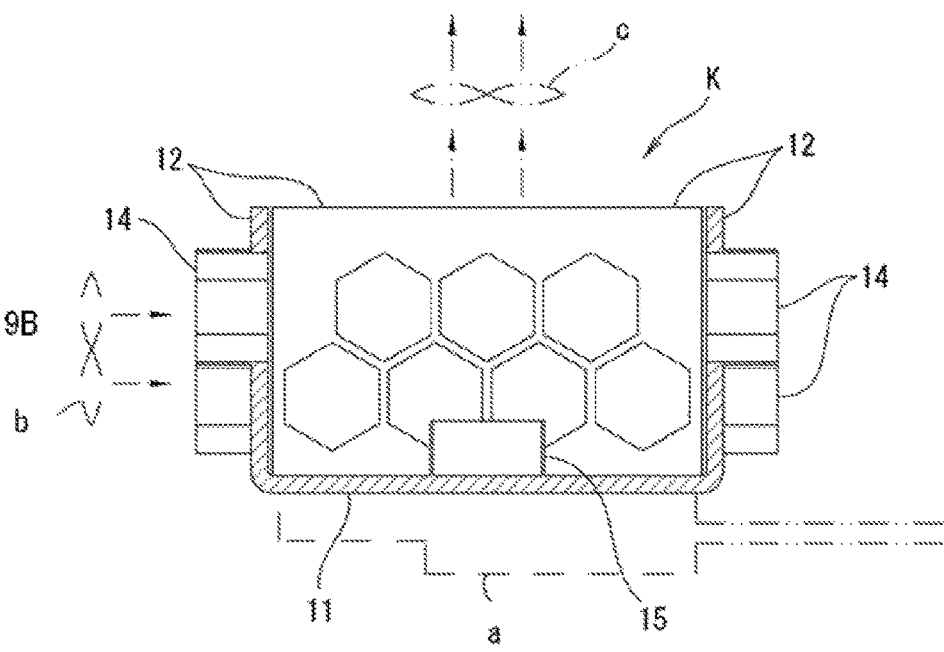
FIG. 19B is a cross-sectional view taken along line b-b of FIG. 19A.

A heat sink K shown in FIGS. 19A and 19B is described next.

The heat sink K is constituted by replacing the tubular protrusions 13 of the foregoing heat sink G with tubular protrusions 14 and adding a protrusion 15 to the base part 11.

A plurality of the tubular protrusions 14 is formed in a tubular shape, protruding outward in a thickness direction of protruding piece parts 12 and having the inside bored in a protruding direction thereof, and are arranged along surfaces of the protruding piece parts 12.

Among the plurality of the tubular protrusions 14, two tubular protrusions 14 adjacent to each other have outer wall surfaces parallel to each other, and these parallel outer wall surfaces are positioned close to each other. The tubular protrusions 14 are each formed in a regular hexagonal shape and are arranged in the form of a honeycomb. In FIG. 19A, the alphabet "s" represents a gap secured between the parallel surfaces described above.

Also, the protrusion 15 is formed into a tubular shape (a cylindrical shape, in the illustrated example) and protrudes upward from a substantially central portion of the base part 11. A bottom surface inside this protrusion 15 constitutes a upper surface of the base part 11. In other words, the interior of this protrusion 15 is formed in a recessed shape in such a manner that the bottom portion thereof is not perforated. This protrusion 15 thermally conducts heat of the base part 11 upward promptly and dissipates the heat to a space.

If needed, fans "b", "c" are provided around the heat sink K (see FIG. 19B).

Note that only one protrusion 15 is provided in the illustrated example; however, another example is possible in which a plurality of the protrusion 15 is provided along an inner surface of the base part 11 to further enhance the heat dissipation effect.

The protrusion 15 can be replaced with protrusions 16, 17, 18 shown in FIGS. 20A to 20C.

The protrusion 16 shown in FIG. 20A is formed in a hexagonal tubular shape, and one or a plurality of the protrusions 16 is provided on the upper surface of the base part 11. In a case where a plurality of the protrusions 16 is provided, it is preferred that these protrusions 16 be arranged in the form of a honeycomb, as with the tubular protrusions 13 (see FIG. 14) or the tubular protrusions 14 (see FIG. 19A) described above.

The protrusion 17 shown in FIG. 20B is constituted by arranging a plurality of flat plate portions 17a in a radial manner when viewed cross-sectionally, the flat plate portions 17a being substantially orthogonal to the upper surface of the base part 11.

According to the constitution of this protrusion 17, the plurality of the flat plate portions 17a can secure a relatively wide heat dissipation area, thereby improving a heat dissipation performance.

As with the foregoing aspects, one or more of the protrusions 17 can be provided.

Also, the protrusion 18 shown in FIG. 20C is formed into a relatively thin, solid columnar shape (a cylindrical shape, in the illustrated example). A large number of the protrusions 18 are arranged on the upper surface of the base part 11 to improve the heat dissipation performance on the upper surface side of the base part 11.

The cross-sectional shape of the protrusion 18 is not limited to the one in the illustrated example and therefore can be, for example, a polygonal shape such as a hexagonal shape, an elliptic shape, or any other shape.

A modification of the heat sink K is possible in which, as with the heat sink G (see FIG. 14), tubular protrusions 14 adjacent to each other are formed integrally while sharing a wall part located therebetween.

On the contrary, a modification of the heat sink G is possible in which, as with the heat sink K, the tubular protrusions 13 adjacent to each other are separated, and the outer wall surfaces thereof that are parallel to each other are brought close to each other between these tubular protrusions.

Furthermore, according to the heat sinks E to K, the four protruding piece parts 4, 6, or 12 are arranged in the shape of a square frame, but another example is possible in which the protruding piece parts 4, 6, or 12 are arranged in the shape of a rectangular frame or a polygonal frame (a triangular frame, a pentagonal frame, a hexagonal frame, etc.).

Yet another example is possible in which a plurality of curved protruding piece parts (not shown) is arranged so as to surround the space above the base part 3.

According to a preferred constitution that can be added to the heat sinks A to K, exposed surfaces of the base part, the protruding piece parts, and the tubular protrusions are each covered with an alumite layer (not shown).

More specifically, the heat sinks A to K are each immersed in an electrolyte in an alumite treatment electrolytic bath and then alumite treatment is performed on all the surfaces of the heat sinks A to K.

According to this constitution, alumite layers are formed on all the surfaces of the heat sinks A to K, including the exposed surfaces, wherein an amount of heat dissipation through radiation can be increased by these alumite layers.

The present invention is not limited to the foregoing embodiments and can be appropriately modified without changing the gist of the present invention.

[Reference Signs List]
1, 3, 11 Base part
2, 2' Heat dissipating part
2a, 2b, 4, 6, 12 Protruding piece part
2c Connecting piece part
2d, 5, 13, 13', 14 Tubular protrusion
6a Groove
6b Protruding stripe
a Electronic component
b, c Fan
A to K Heat sink

What is claimed is:

1. A heat sink, comprising:
a tabular base part;
a tabular protruding piece part that protrudes from the tabular base part toward one side in a thickness direction of the tabular base part; and
a tubular protrusion which protrudes from the tabular protruding piece part in a thickness direction of the tabular protruding piece part, and an inside of the tubular protrusion is bored in a protruding direction thereof,
wherein a plurality of the tabular protruding piece parts is provided in such a manner as to surround a space on one side of the tabular base part in the thickness direction thereof,
a contact surface with which an electronic component is brought into contact is secured on the tabular base part on the other side opposite to the one side,
the tubular protrusion is formed in a polygonal tubular shape and protrudes in a direction opposite to the space, and a plurality of the tubular protrusions is provided along a surface of each of the tabular protruding piece parts,
two of the tubular protrusions that are adjacent to each other are constituted integrally while sharing a shared wall part located therebetween, and
outer surfaces of wall parts other than the shared wall part of a plurality of the tubular protrusions are exposed to an outside.

2. The heat sink according to claim 1, wherein the outer surfaces of the wall parts other than the shared wall part of the plurality of the tubular protrusions are arranged in an uneven manner.

3. The heat sink according to claim 1, wherein the plurality of the tubular protrusions is arranged in a row so as to be substantially parallel to a surface direction of the tabular base part.

4. The heat sink according to claim 3, wherein the plurality of the tubular protrusions in the row is arranged side by side so as to be substantially parallel to the thickness direction of the tabular base part, and a number of tubular protrusions in a row opposite to the tabular base part is smaller than a number of tubular protrusions on a tabular base part side.

5. The heat sink according to claim 1, wherein each of the tabular protruding piece parts is provided with a flat region not having any tubular protrusions or through holes, at a position away from the plurality of the tubular protrusions toward a side opposite to the tabular base part.

6. The heat sink according to claim 1, wherein the tabular base part is provided with a protrusion protruding toward the space.

7. The heat sink according to claim 1, further comprising a fan such that gas in a vicinity of the tubular protrusions is caused to flow.

8. An electronic component package comprising the heat sink according to claim 1, wherein an electronic component is brought into contact with and supported by the contact surface of the tabular base part.

9. A heat sink, comprising:
a tabular base part;
a tabular protruding piece part that protrudes from the tabular base part toward one side in a thickness direction of the tabular base part; and
a tubular protrusion which protrudes from the tabular protruding piece part in a thickness direction of the tabular protruding piece part, and an inside of the tubular protrusion is bored in a protruding direction thereof,
wherein a plurality of the tabular protruding piece parts is provided in such a manner as to surround a space on one side of the tabular base part in the thickness direction thereof,
a contact surface with which an electronic component is brought into contact is secured on the tabular base part on the other side opposite to the one side,
the tubular protrusion is formed in a hexagonal tubular shape and protrudes in a direction opposite to the space, and a plurality of the tubular protrusions is provided along a surface of each of the tabular protruding piece parts,
two of the tubular protrusions that are adjacent to each other are constituted integrally while sharing a side portion of each of the tubular protrusions as a shared wall part, and
outer surfaces of wall parts other than the shared wall part of a plurality of the tubular protrusions are exposed to an outside.

10. The heat sink according to claim 9, wherein the outer surfaces of the wall parts other than the shared wall part of the plurality of the tubular protrusions are arranged in an uneven manner.

11. The heat sink according to claim 9, wherein the plurality of the tubular protrusions is arranged in a row so as to be substantially parallel to a surface direction of the tabular base part.

12. The heat sink according to claim 11, wherein the plurality of the tubular protrusions in the row is arranged side by side so as to be substantially parallel to the thickness direction of the tabular base part, and a number of tubular protrusions in a row opposite to the tabular base part is smaller than a number of tubular protrusions on a tabular base part side.

13. The heat sink according to claim 9, wherein each of the tabular protruding piece parts is provided with a flat region not having any tubular protrusions or through holes, at a position away from the plurality of the tubular protrusions toward a side opposite to the tabular base part.

14. The heat sink according to claim 9, wherein the tabular base part is provided with a protrusion protruding toward the space.

15. The heat sink according to claim 9, further comprising a fan such that gas in a vicinity of the tubular protrusions is caused to flow.

16. An electronic component package comprising the heat sink according to claim 9, wherein an electronic component is brought into contact with and supported by the contact surface of the tabular base part.

* * * * *